(12) United States Patent
Park et al.

(10) Patent No.: US 12,266,414 B2
(45) Date of Patent: Apr. 1, 2025

(54) MEMORY DEVICE AND TEST METHOD OF MEMORY DEVICE

(71) Applicant: Samsung Electronics Co., Ltd., Suwon-si (KR)

(72) Inventors: Jaewon Park, Suwon-si (KR); Sukhan Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 290 days.

(21) Appl. No.: 18/059,124

(22) Filed: Nov. 28, 2022

(65) Prior Publication Data

US 2023/0402123 A1 Dec. 14, 2023

(30) Foreign Application Priority Data

Jun. 14, 2022 (KR) .................. 10-2022-0072434
Aug. 4, 2022 (KR) .................. 10-2022-0097584

(51) Int. Cl.
*G11C 29/46* (2006.01)
*G11C 29/12* (2006.01)
*G11C 29/36* (2006.01)

(52) U.S. Cl.
CPC ........ *G11C 29/46* (2013.01); *G11C 29/12005* (2013.01); *G11C 29/36* (2013.01); *G11C 2029/3602* (2013.01)

(58) Field of Classification Search
CPC ... G11C 29/46; G11C 29/12005; G11C 29/36; G11C 2029/3602; G11C 2029/5004; G11C 29/021
See application file for complete search history.

(56) References Cited

U.S. PATENT DOCUMENTS

| 5,970,011 | A | 10/1999 | Shih et al. |
| 6,226,200 | B1 | 5/2001 | Eguchi et al. |
| 7,315,483 | B2 | 1/2008 | Jang |
| 7,564,265 | B2 | 7/2009 | Ikejiri et al. |
| 10,712,759 | B2 | 7/2020 | Zhang et al. |
| 2010/0188115 | A1 | 7/2010 | Von |
| 2015/0378385 | A1* | 12/2015 | Rana .............. H03K 3/3562 |
| | | | 327/143 |

(Continued)

FOREIGN PATENT DOCUMENTS

| EP | 2929607 B1 | 9/2020 |
| JP | 2001266596 A | 9/2001 |

(Continued)

*Primary Examiner* — Jerome Leboeuf
(74) *Attorney, Agent, or Firm* — Myers Bigel, P.A.

(57) ABSTRACT

Provided is a memory device including a cell array, a peripheral circuit configured to control a memory operation of the plurality of memory cells, a test logic circuit configured to operate in a test mode and configured to perform a test operation on the plurality of memory cells, a first regulator configured to regulate a first power supply voltage received through a first pad and provide the first power supply voltage to at least one of the cell array and the peripheral circuit, and a power manager between the first pad and an input terminal of the first regulator, and between the first pad and the test logic circuit and configured to provide a test power supply voltage to the test logic circuit. In the test mode, while a first target voltage level of the first regulator fluctuates, a second target voltage level of the power manager is maintained constant.

20 Claims, 16 Drawing Sheets

(56) References Cited

U.S. PATENT DOCUMENTS

2020/0176070 A1\* 6/2020 Jimenez-Olivares ........................ G11C 29/028
2020/0243119 A1\* 7/2020 Spica .................. G06F 11/0727
2020/0333818 A1\* 10/2020 Yun ........................... G06F 1/28

FOREIGN PATENT DOCUMENTS

| | | |
|---|---|---|
| JP | 2007303868 A | 11/2007 |
| KR | 20010074065 A | 8/2001 |
| KR | 20040002112 A | 1/2004 |
| KR | 20070019403 A | 2/2007 |
| KR | 20200068142 A | 6/2020 |

\* cited by examiner

MEMORY DEVICE AND TEST METHOD OF MEMORY DEVICE

CROSS-REFERENCE TO RELATED APPLICATIONS

This application is based on and claims priority under 35 U.S.C. § 119 to Korean Patent Application Nos. 10-2022-0072434, filed on Jun. 14, 2022, and 10-2022-0097584, filed on Aug. 4, 2022, in the Korean Intellectual Property Office, the disclosures of which are incorporated by reference herein in their entireties.

BACKGROUND

The inventive concept relates to a memory device, and more particularly, to a memory device with improved operational stability in a test mode and a method of testing the memory device.

The memory device may be tested in various processes of mass production, and as an example, as a test logic circuit is included in the memory device, various operations necessary for the test operation may be performed by the test logic circuit.

The memory device may include a cell array and peripheral circuits, and various types of power supply voltages may be provided to components in the memory device to operate the cell array, the peripheral circuits, and the test logic circuit. In this case, in the test mode, unlike the cell array and the peripheral circuits, in the test logic circuit, the sensitivity of the power supply voltage to noise must be reduced to ensure the accuracy of the test operation.

SUMMARY

The inventive concept provides a memory device and a test method of the memory device capable of improving the accuracy of a test operation based on the separation of a power path through which a power supply voltage is transmitted in the memory device.

According to some embodiments of the inventive concept, there is provided a memory device including a cell array including a plurality of memory cells, a peripheral circuit configured to control a memory operation of the plurality of memory cells, a test logic circuit configured to operate in a test mode and configured to perform a test operation on the plurality of memory cells, a first regulator configured to regulate a first power supply voltage received through a first pad and provide the first power supply voltage to at least one of the cell array and the peripheral circuit, and a power manager between the first pad and an input terminal of the first regulator, and between the first pad and the test logic circuit and configured to provide a test power supply voltage generated through a power processing operation for the first power supply voltage to the test logic circuit, wherein, in the test mode, while a first target voltage level of the first regulator fluctuates, a second target voltage level of the power manager is maintained constant.

According to some embodiments of the inventive concept, there is provided a memory device including a cell array including a plurality of memory cells, a peripheral circuit configured to control a memory operation of the plurality of memory cells, a test logic circuit operating in a test mode and configured to perform test logic on the plurality of memory cells, a first pad configured to receive a first power supply voltage from external to the memory device, a second pad configured to receive a second power supply voltage having a different level from the first power supply voltage from external to the memory device, and a power manager configured to receive the first power supply voltage or the second power supply voltage and configured to generate a test power supply voltage provided to the test logic circuit, wherein, in the test mode, the test logic circuit is configured to receive the test power supply voltage through a first power path including the power manager, the cell array is configured to receive the first power supply voltage through a second power path that does not include the power manager, and the peripheral circuit receives the second power supply voltage through a third power path that does not include the power manager.

According to some embodiments of the inventive concept, there is provided a test method of a memory device, the method including providing a first power supply voltage received from external to the memory device to a cell array or a peripheral circuit through a first power path including a first regulator, providing the first power supply voltage to a power manager enabled in a test mode, and providing a test power supply voltage generated by the power manager to a test logic circuit through a second power path that is different from the first power path and includes the power manager, wherein, in the test mode, while the first target voltage level of the first regulator fluctuates, the second target voltage level of the power manager is maintained constant.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments of the present disclosure will be described in detail with reference to the accompanying drawings.

Figure 1:
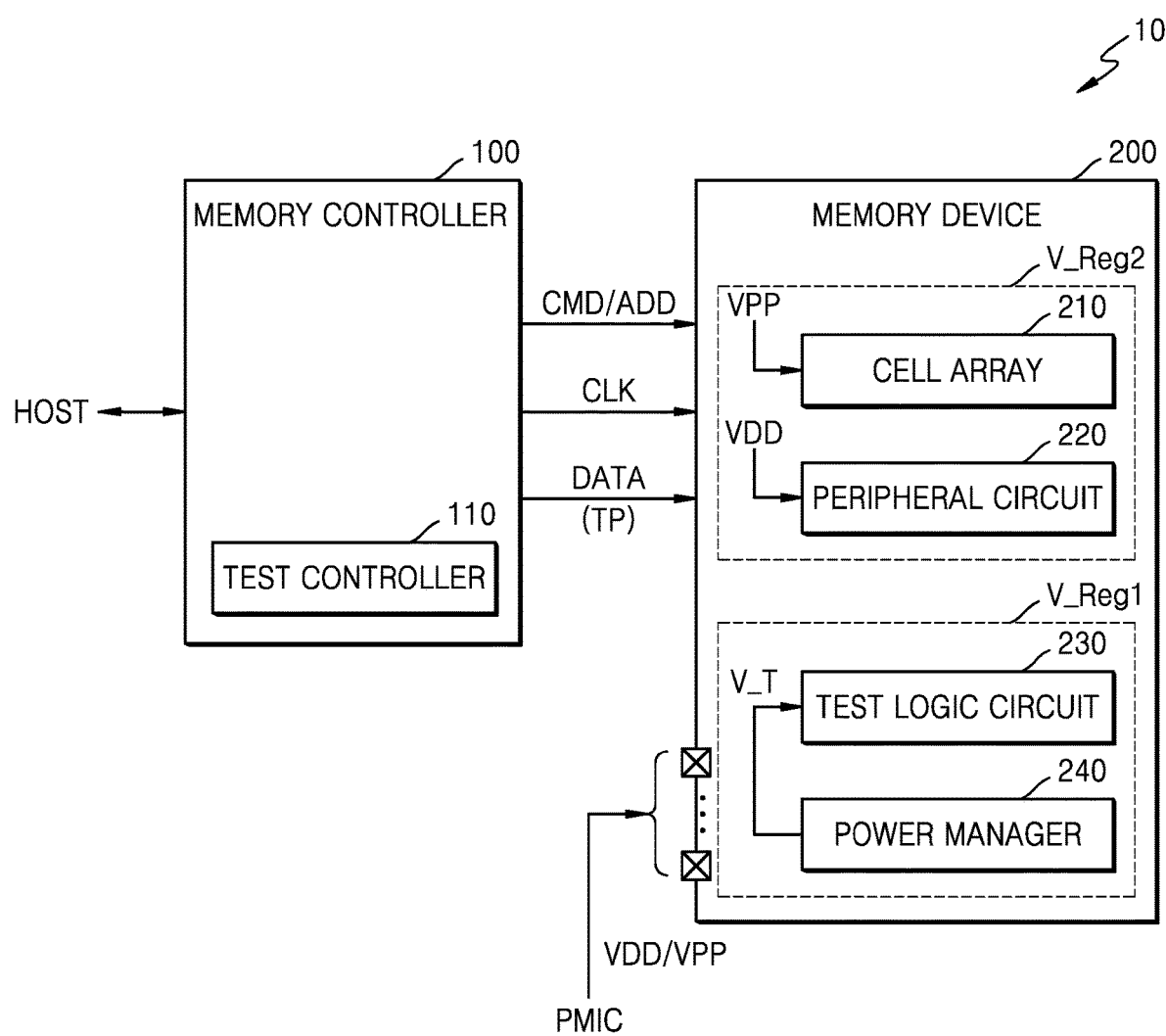
FIG. 1 is a block diagram illustrating a memory system according to some embodiments of the present disclosure.

FIG. 1 is a block diagram illustrating a memory system according to some embodiments of the present disclosure.

Referring to FIG. 1, a memory system 10 may include a memory controller 100 and a memory device 200. The memory device 200 may include a cell array 210 including a plurality of memory cells, a peripheral circuit 220 for controlling memory operations, such as writing and reading data to and from the plurality of memory cells, a test logic circuit 230 that performs various functions related to a test operation in a test mode, and a power manager 240 that provides a power supply voltage to at least one component in the memory device 200. Although not shown in FIG. 1, the memory device 200 may further include at least one other component in relation to a memory operation, and as an example, a control logic for controlling the overall operation of the memory device 200, a circuit for regulating the power supply voltage provided to the components in the memory device 200, and/or a refresh circuit for controlling a refresh operation of the memory cells included in the cell array 210 may be further provided.

The peripheral circuit 220 may include various types of circuit configurations, and may include, as an example, components, such as a row decoder for selecting a row of the cell array 210, a column decoder for selecting a column, and a data input/output circuit. As an example, among the addresses ADD, a row address may be provided to a row decoder, and a column address may be provided to a column decoder, and data DATA may be transmitted/received between the memory controller 100 and the memory device 200 through a column decoder and a data input/output circuit.

The memory controller 100 may provide various signals to the memory device 200 through a memory interface to control memory operations, such as write/read. For example, the memory controller 100 may provide a clock signal CLK and a command/address CMD/ADD to the memory device 200 to access data DATA of the cell array 210. In addition, the memory controller 100 may include a test controller 110 and may transmit/receive various signals to and from the memory device 200 in the test mode, and may perform various performance tests of the memory device 200 based on a signal transmitted to the memory device 200 and a signal provided from the memory device 200. As an example, the memory controller 100 may transmit a test pattern TP to the memory device 200 and store the transmitted test pattern TP in the cell array 210, receive the test pattern TP read from the cell array 210, and generate a test result based on the received test pattern TP.

On the other hand, the memory device 200 may include dynamic random access memory, such as Double Data Rate Synchronous Dynamic Random Access Memory (DDR SDRAM), Low Power Double Data Rate (LPDDR) SDRAM, Graphics Double Data Rate (GDDR) SDRAM, Rambus Dynamic Random Access Memory (RDRAM), or the like. However, embodiments of the present disclosure need not be limited thereto, and as an example, various types of memories, such as nonvolatile memories, such as flash memory, magnetic RAM (MRAM), ferroelectric RAM (Fe-RAM), phase change RAM (PRAM), and resistive RAM (ReRAM), may be applied to the embodiments of the present disclosure.

The memory device 200 may include a pad that receives one or more power supply voltages from an external device (e.g., a power management IC (PMIC)). As an example, the first pad of the memory device 200 may receive the first power supply voltage VDD, and the second pad may receive the second power supply voltage VPP. In some embodiments, the second power supply voltage VPP may have a higher voltage level than the first power supply voltage VDD. In addition, although not shown in FIG. 1, the memory device 200 may include one or more regulators, and a voltage obtained by regulating the first power supply voltage VDD and the second power supply voltage VPP may be provided to various components in the memory device 200. In the following examples, the power supply voltage provided to the input of the regulator and the power supply voltage as the output of the regulator will be described in the same terms, but the voltage corresponding to the input and the voltage corresponding to the output of the regulator may be defined as different terms.

According to some embodiments of the present disclosure, in the test mode, the test logic circuit 230 may receive a power supply voltage through a separate and distinct power path from the cell array 210 and the peripheral circuit 220. That is, in the test mode, a first power region Vreg_1 including the test logic circuit 230 and the power manager 240 and a second power region Vreg_2 including the cell array 210 and the peripheral circuit 220 may be separated from each other, and accordingly, even if noise is generated by the power supply voltage provided to the cell array 210 and/or the peripheral circuit 220, the noise of the power supply voltage provided to the test logic circuit 230 may be removed or reduced.

Also, in the test mode, the target voltage level of the power supply voltage provided to the cell array 210 and/or the peripheral circuit 220 may be set to be different from the target voltage level of the power supply voltage provided to the test logic circuit 230. For example, in the test mode, the test may be performed while the power supply voltage provided to the cell array 210 and/or the peripheral circuit 220 is changed by a predetermined voltage level for testing in various operating environments, but the target voltage level of the power supply voltage provided to the test logic circuit 230 may be maintained at the same voltage value during the test operation so that the voltage level of the power supply voltage is constant.

In some embodiments, the power manager 240 may receive the first power supply voltage VDD or the second power supply voltage VPP and provide the test power supply voltage V_T to the test logic circuit 230. For example, the power manager 240 receives the first power supply voltage VDD and performs a power processing operation including regulating the first power supply voltage VDD, and as an example, may perform a processing operation of adjusting or boosting the voltage level and a regulating operation of maintaining the voltage level at a predetermined target voltage level. Through the configuration and processing described above, the power manager 240 may provide the test power supply voltage V_T to the test logic circuit 230 through the first power path. In the following embodiments, the power manager 240 may be referred to as a test logic power manager (TLPM) in terms of controlling a power supply voltage related to a test logic circuit.

On the other hand, each of the cell array 210 and the peripheral circuit 220 may receive a power supply voltage through a power path that is distinct from the first power path, and as an example, a power path that provides a power supply voltage to the cell array 210 and the peripheral circuit 220 may correspond to a path that does not include the power manager 240. For example, the cell array 210 may receive the second power supply voltage VPP through the second power path, and the peripheral circuit 220 may receive the first power supply voltage VDD through the third power path. In some embodiments, one or more regulators (not shown) may be provided in the memory device 200, and each of the first power supply voltage VDD and the second power supply voltage VPP may be regulated by a regulator and provided to the peripheral circuit 220 or the cell array 210. As an example, any one of the regulators may perform a regulating operation for the first power supply voltage VDD and the second power supply voltage VPP, or a regulator may be disposed for each of the first power supply voltage VDD and the second power supply voltage VPP.

According to some embodiments of the present disclosure as described above, by separating the power path of the cell array 210 and the peripheral circuit 220 from the power path of the test logic circuit 230, the sensitivity of the test logic circuit 230 may be lowered, and accordingly, the accuracy of the test may be improved. In addition, when performing a high-speed test, the test logic circuit 230 operates faster than other components, and when the cell array 210/the peripheral circuit 220 and the like and the test logic circuit 230 have the same sensitivity, the performance of the test logic circuit 230 may be further weakened, and according to embodiments of the present disclosure, since the sensitivity of the test logic circuit 230 may be reduced, test performance may be improved even in a high-speed test environment.

Meanwhile, in some embodiments, the memory device 200 may include one or more memory chips (or dies). For example, a semiconductor package or memory module may include one or more memory chips, and the memory device 200 of FIG. 1 may be one memory chip mounted in the semiconductor package or memory module. In some embodiments, one memory chip may include a plurality of dies stacked on each other, and the memory device 200 may include the plurality of dies.

Figure 2A:
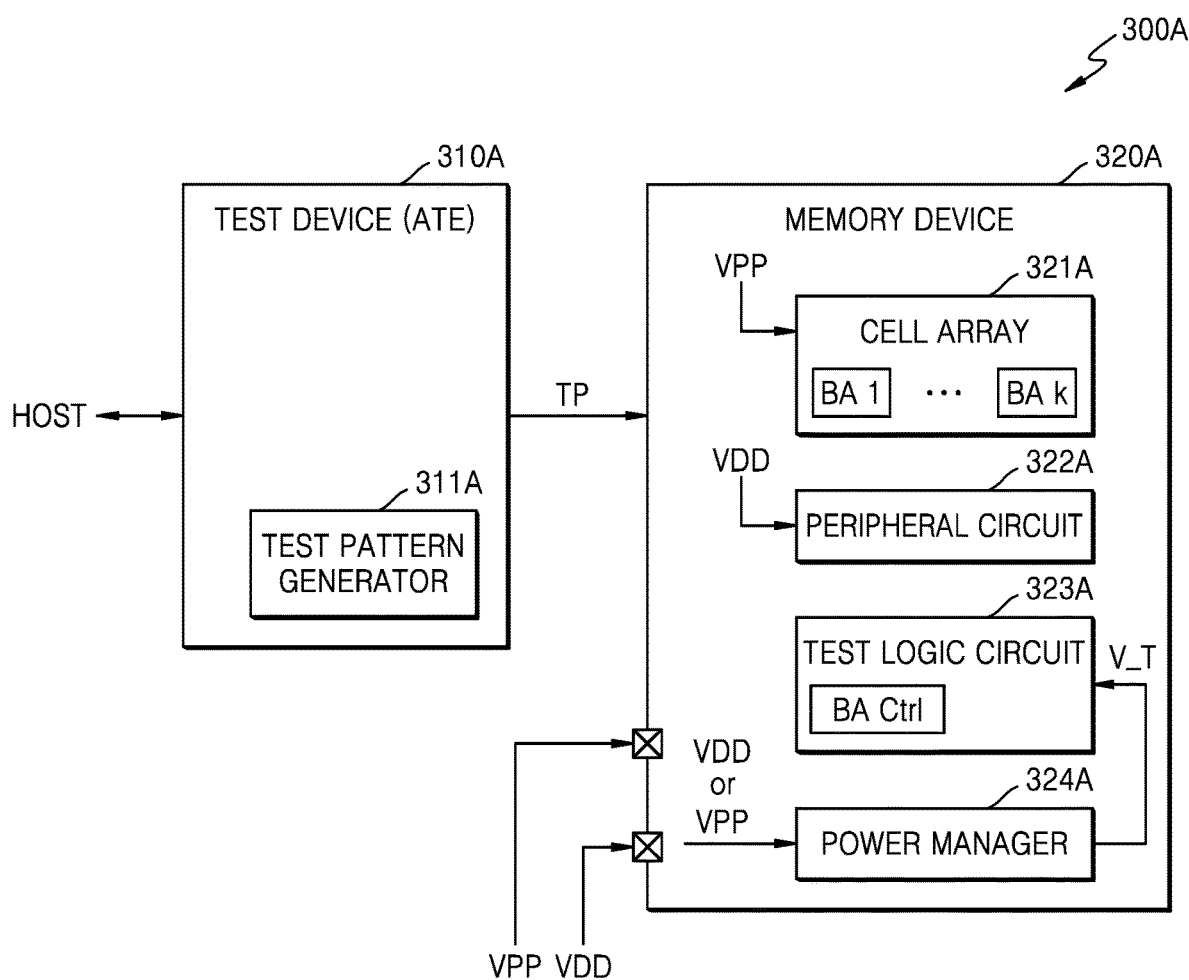
FIGS. 2A and 2B are block diagrams illustrating memory devices according to various embodiments of the present disclosure.
Figure 2B:
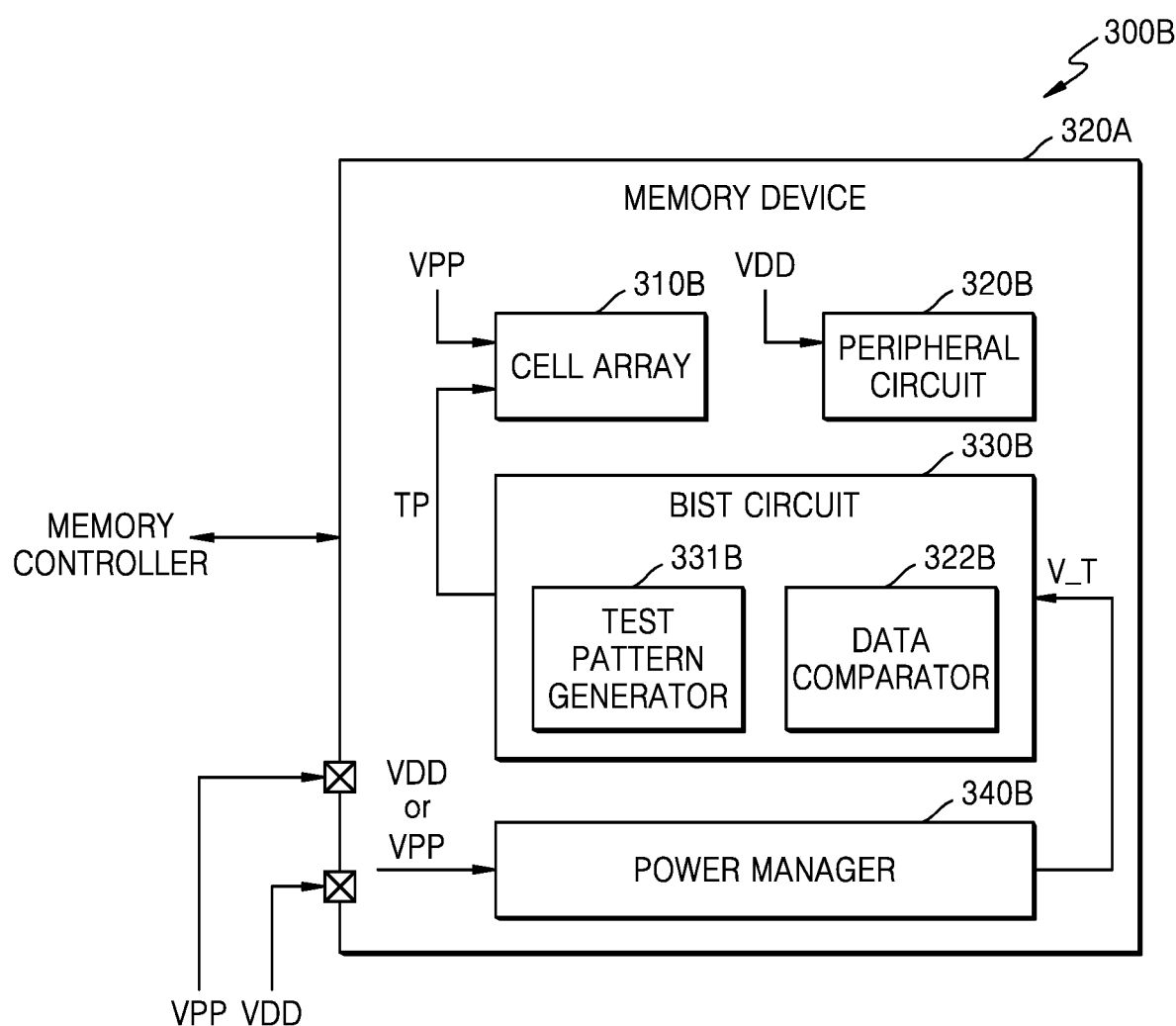

FIGS. 2A and 2B are block diagrams illustrating memory devices according to various embodiments of the present disclosure.

Referring to FIG. 2A, a memory device 320A may be tested as a Device Under Test (DUT), and a test device 310A such as Automatic Test Equipment (ATE) and the memory device 320A may constitute a test system 300A. Although not shown in FIG. 2A, a test board communicating with the test device 310A may be further provided in the test system 300A, and a plurality of sockets to which DUTs are mounted may be disposed on the test board. Also, the memory device 320A according to some embodiments of the present disclosure may be mounted in a socket on the test board to communicate with the test device 310A.

The test device 310A may include a test pattern generator 311A and provide the test pattern TP to the memory device 320A. According to some embodiments, the test device 310A may include a processor that generates a test result through communication with the memory device 320A, and as an example, may include a semiconductor chip, such as a field programmable gate array (FPGA), an application specific integrated circuit (ASIC), an application processor (AP), and the like.

Meanwhile, the memory device 320A may include a cell array 321A, a peripheral circuit 322A, a test logic circuit 323A, and a power manager 324A. Also, the memory device 320A may further include a first pad receiving the first power supply voltage VDD and a second pad receiving the second power supply voltage VPP. In FIG. 2A, it is illustrated that the first power supply voltage VDD and the second power supply voltage VPP are provided from the outside of or external to the test device 310A but the test device 310A may provide the first power supply voltage VDD and the second power supply voltage VPP.

According to the above-described embodiments, a power path of the test power supply voltage V_T provided to the test logic circuit 323A may be different from power paths of the first power supply voltage VDD and the second power supply voltage VPP respectively provided to the cell array 321A and/or the peripheral circuit 322A. For example, the power manager 324A may receive the first power supply voltage VDD or the second power supply voltage VPP, and provide the test power supply voltage V_T generated based on the voltage level adjustment and/or regulating operation to the test logic circuit 323A. On the other hand, the cell array 321A may receive the second power supply voltage VPP through a power path that does not pass through the power manager 324A, and/or the peripheral circuit 322A may receive the first power supply voltage VDD through a power path that does not pass through the power manager 324A.

In some embodiments, the cell array 321A may include a plurality of banks BA1 to BAk. In the normal mode, a data write/read operation is performed on any one of the plurality of banks BA1 to BAk, whereas when a data write/read operation is performed in the test mode, data (or data pattern) write/read operations may be simultaneously performed on the plurality of banks BA1 to BAk. The test logic circuit 323A may include a bank controller for selecting the plurality of banks BA1 to BAk together.

Meanwhile, referring to FIG. 2B, as a memory device 300B includes a built-in self-test (BIST) circuit 330B, the memory device 300B may perform a test operation by itself. In some embodiments, the memory device 300B may enter the self-test mode through communication with the memory controller (or host), and in the self-test mode, the BIST circuit 330B may generate a test pattern TP and provide the generated test pattern TP to a cell array 310B.

The memory device 300B may further include a peripheral circuit 320B and a power manager 340B according to the above-described embodiments, along with the cell array 310B and the BIST circuit 330B. Also, the memory device 300B may further include a first pad receiving the first power supply voltage VDD and a second pad receiving the second power supply voltage VPP. In addition, the BIST circuit 330B may include a test pattern generator 331B and a data comparator 332B, and the data comparator 332B may generate a test result based on comparing the test pattern TP provided to the cell array 310B with the test pattern TP read from the cell array 310B.

Meanwhile, according to embodiments of the present disclosure, the cell array 310B, the peripheral circuit 320B, and the BIST circuit 330B may be located in different power regions in the memory device 300B in the test mode. For example, the BIST circuit 330B may receive the test power supply voltage V_T through a power path including the power manager 340B, and each of the cell array 310B and the peripheral circuit 320B may receive the first power supply voltage VDD or the second power supply voltage VPP through a power path that does not include the power manager 340B.

Figure 3:
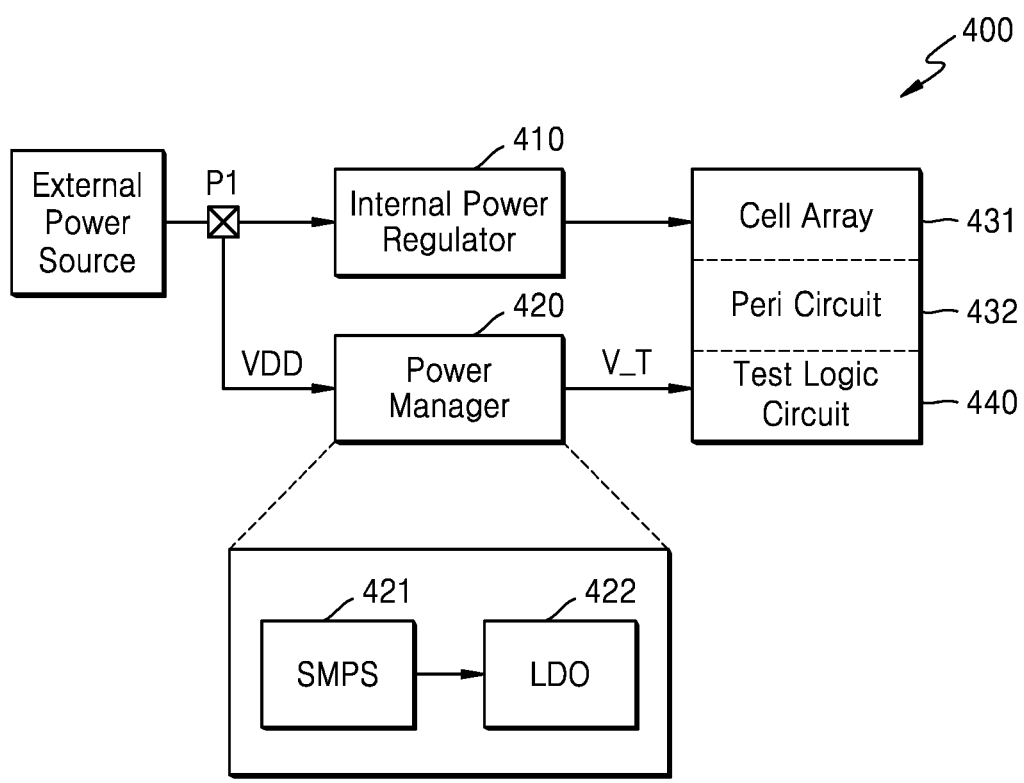
FIG. 3 is a block diagram illustrating an implementation example of a memory device according to some embodiments of the present disclosure.

FIG. 3 is a block diagram illustrating an implementation example of a memory device according to some embodiments of the present disclosure.

Referring to FIG. 3, a memory device 400 may include an internal power regulator 410, a cell array 431, a peripheral circuit 432, a test logic circuit 440, and a power manager 420. Also, the memory device 400 may include a first pad P1 and may receive the first power supply voltage VDD from an external power source through the first pad P1. In addition, the power manager 420 may include a voltage level adjuster 421 and a regulator 422, and each of the voltage level adjuster 421 and the regulator 422 may include various types of circuit blocks that perform corresponding functions, and in FIG. 3, as an example, the voltage level adjuster 421 includes a switching mode power supply (SMPS) and the regulator 422 includes a low dropout (LDO) regulator.

The first power supply voltage VDD received through the first pad PA may be provided to the internal power regulator 410 and the power manager 420, and power paths of power supply voltages transferred in the test mode may be separated inside the memory device 400. For example, the power manager 420 may be electrically connected to a node between the first pad P1 and the internal power regulator 410, and the test logic circuit 440 may receive the test power supply voltage V_T through a power path through the power manager 420. Also, the first power supply voltage VDD may be provided to each of the cell array 431 and the peripheral circuit 432 through a power path that does not pass through the power manager 420.

In some embodiments, in the test mode, the same level of power supply voltages or different levels of power supply voltages may be provided to the cell array 431 and the peripheral circuit 432. For example, the internal power regulator 410 may provide the first power supply voltage VDD of the same level or different levels to the cell array 431 and the peripheral circuit 432, respectively, based on the regulating operation of the first power supply voltage VDD for a preset target voltage level. At this time, to test the performance of the memory device 400 under various operating environments, a test operation may be performed under various PVT conditions, and the internal power regulator 410 may output the voltage level of the first power supply voltage VDD while changing the voltage level of the first power supply voltage VDD by a preset level (or a preset ratio).

On the other hand, the power manager 420 may generate the test power supply voltage V_T according to the target voltage level maintaining a constant value based on the power processing operation for the first power supply voltage VDD in the test mode. At this time, the test logic circuit 440 may be provided with a test power supply voltage V_T having a higher voltage level than the first power supply voltage VDD for stable operation, and the voltage level adjuster 421 may perform a boosting operation on the first power supply voltage VDD, and the regulator 422 may receive the boosted voltage and generate a test power supply voltage V_T corresponding to a preset target voltage level based on the regulating operation.

Figure 4:
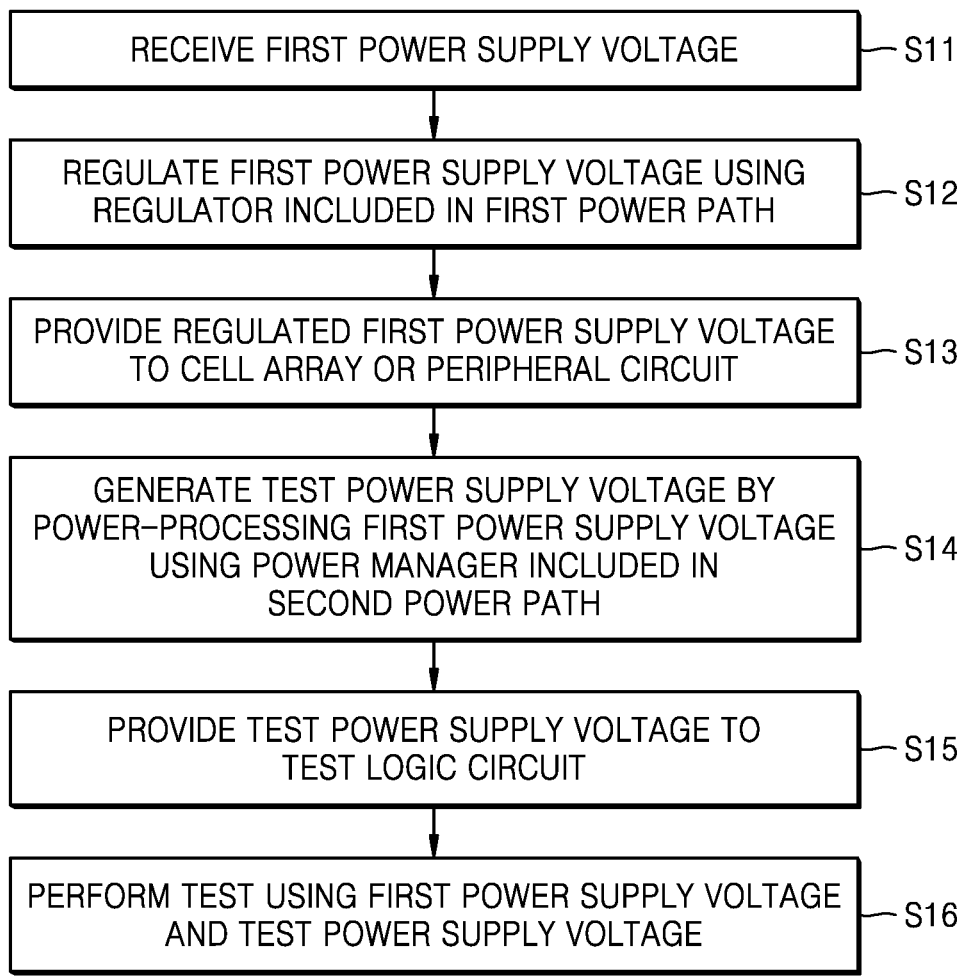
FIG. 4 is a flowchart illustrating a method of testing a memory device, according to some embodiments of the present disclosure.

FIG. 4 is a flowchart illustrating a method of testing a memory device, according to some embodiments of the present disclosure.

Referring to FIG. 4, the memory device may perform a test operation based on the control of a host or test equipment, may include a test logic circuit including various components related to a test operation, and may receive a power supply voltage from the outside (external to the memory device) and provide the received power supply voltage to various components in the memory device. For example, the memory device may receive the first power supply voltage in operation S11, and may generate a power supply voltage provided to the cell array and/or a peripheral circuit by using the first power supply voltage, or may generate a test power supply voltage provided to the test logic circuit.

According to the above-described embodiments, the memory device may include a plurality of power regions, and the cell array or peripheral circuit included in the first power region may receive the power supply voltage through the first power path. On the other hand, the test logic circuit included in the second power region may receive the test power supply voltage through the second power path.

The memory device may regulate the first power supply voltage using a regulator included in the first power path in operation S12. In some embodiments, the target voltage level of the regulator may be changed during the test operation, and accordingly, the voltage level of the first power supply voltage may be changed at least once during the test operation. In addition, the regulated first power supply voltage may be provided to the cell array or the peripheral circuit in operation S13, and accordingly, various components of the memory device may be tested in various operating environments.

Meanwhile, the memory device may perform power processing on the first power supply voltage by using the power manager included in the second power path, and generate a test power supply voltage through this process in operation S14. In some embodiments, the power manager may generate a test power supply voltage by performing an operation of adjusting and regulating a voltage level, and may provide the test power supply voltage to the test logic circuit in operation S15. In some embodiments, while the voltage level of the regulated first power supply voltage is changed in the test mode, the voltage level of the test power supply voltage may be constantly maintained. Also, a test operation may be performed based on the first power supply voltage and the test power supply voltage provided to the various components in the memory device in operation S16.

Figure 5:
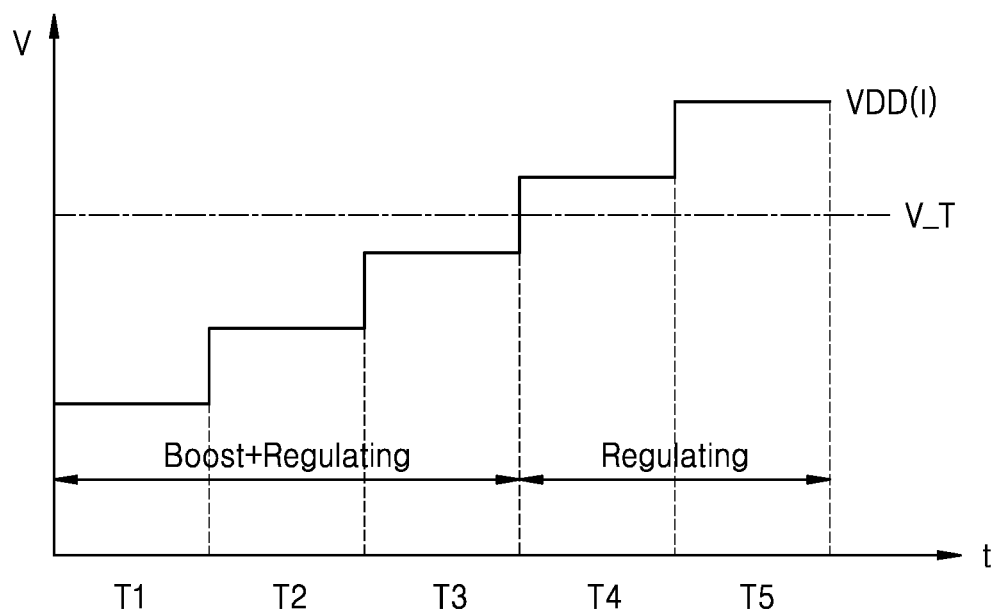
FIG. 5 is a diagram illustrating an example of a level of a power supply voltage provided to a peripheral circuit and a test logic circuit of a memory device in a test mode.

FIG. 5 is a diagram illustrating an example of a voltage level of a power supply voltage provided to a peripheral circuit and a test logic circuit of a memory device in a test mode. FIG. 5 illustrates an example in which the power manager generates a test power supply voltage using the first power supply voltage VDD provided to a peripheral circuit. In addition, in the embodiment shown in FIG. 5, an external device (e.g., a PMIC) adjusts and provides the voltage level of the first power supply voltage VDD to the memory device in the test mode. Accordingly, in FIG. 5, the first power supply voltage VDD is referred to as an input first power supply voltage VDD(I).

Referring to FIG. 5, various sections (e.g., first to fifth sections T1 to T5) may be included in the test mode, and for testing in the environment of the power supply voltage of various voltage levels in the first to fifth sections T1 to T5, the voltage level of the input first power supply voltage VDD(I) provided to the memory device may be changed in stages. For example, the voltage level of the input first power supply voltage VDD(I) may increase stepwise through the first to fifth sections T1 to T5.

The power manager may generate the test power supply voltage V_T maintaining a constant target voltage level based on the boosting process and/or the regulating operation for the input first power supply voltage VDD(I). For example, in the first to third sections T1 to T3, as the input first power supply voltage VDD(I) is lower than the target voltage level of the test power supply voltage V_T, the power manager may perform boosting processing and regulating operations on the input first power supply voltage VDD(I). On the other hand, in the fourth and fifth sections T4 and T5, as the input first power supply voltage VDD(I) is higher than the target voltage level of the test power supply voltage V_T, the power manager may only perform a regulating operation on the input first power supply voltage VDD(I).

In the embodiment shown in FIG. 5, a case in which the voltage level of the input first power supply voltage VDD(I) is changed is shown as an example, but according to the above-described embodiments, the input first power supply voltage VDD(I) of the same level is provided to the memory device, and based on the regulating operation, a power supply voltage having a voltage level according to the waveform shown in FIG. 5 may be generated and provided to a cell array and/or a peripheral circuit.

Figure 6:
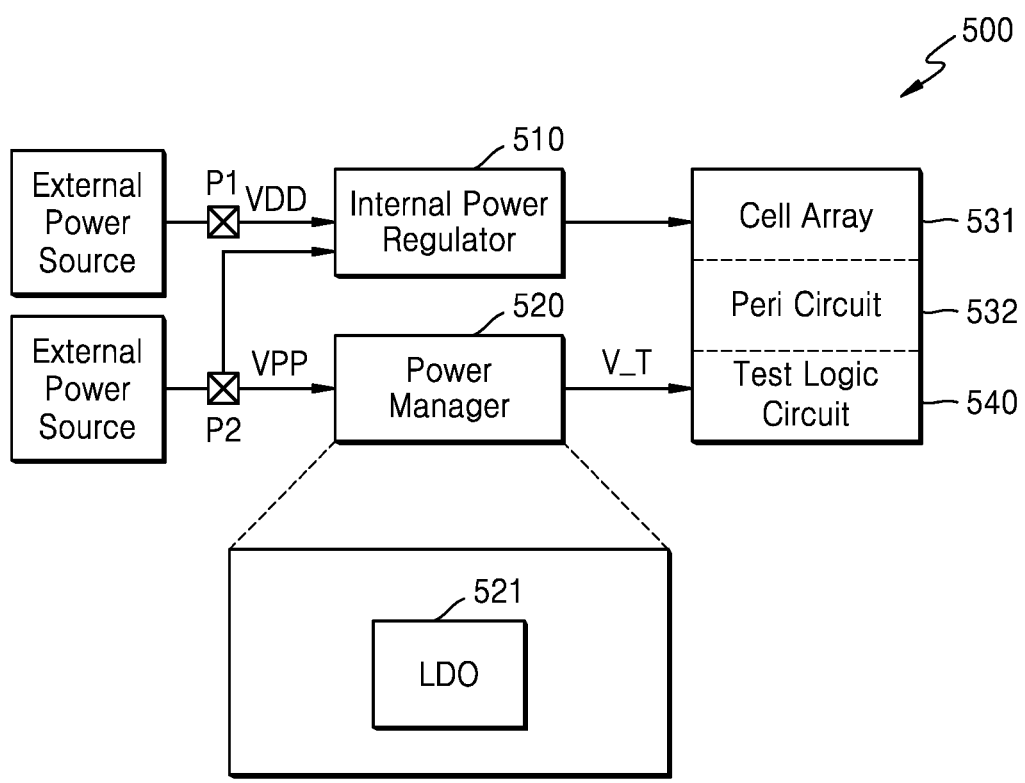
FIG. 6 is a block diagram illustrating an implementation example of a memory device according to some embodiments of the present disclosure.

FIG. 6 is a block diagram illustrating an implementation example of a memory device according to some embodiments of the present disclosure.

Referring to FIG. 6, the memory device 500 may include an internal power regulator 510, a cell array 531, a peripheral circuit 532, a test logic circuit 540, and a power manager 520. In addition, the memory device 500 includes a first pad P1 and a second pad P2, and may receive the first power supply voltage VDD from an external power source through the first pad P1, and receive the second power supply voltage VPP from the external power source through the second pad P2. The external power received at first pad P1 and second pad P2 may be received from a single external power source or from different external power sources. In addition, the power manager 520 may include a regulator 521 implemented as an LDO regulator or the like, and the regulator 521 may generate the test power supply voltage V_T by regulating the first power supply voltage VDD or the second power supply voltage VPP.

In some embodiments, the voltage level of the second power supply voltage VPP may be higher than that of the first power supply voltage VDD, and the internal power regulator 510 regulates the first power supply voltage VDD and the second power supply voltage VPP, and provides the first power supply voltage VDD to the cell array 531 and the second power supply voltage VPP to the peripheral circuit 532. Although one regulator is illustrated in FIG. 6, separate regulators may be disposed corresponding to each of the first power supply voltage VDD and the second power supply voltage VPP.

According to the above-described embodiments, the test power supply voltage V_T may be provided to the test logic circuit 540 through a power path through the power manager 520, and accordingly, in the test mode, the power path to the cell array 531 and the peripheral circuit 532 and the power path to the test logic circuit 540 may be electrically or physically separated from each other.

According to some embodiments, the power manager 520 may receive the second power supply voltage VPP and perform a regulating operation thereon. Since the second power supply voltage VPP has a higher voltage level than the first power supply voltage VDD, the power manager 520 may adjust the test power supply voltage V_T to a target voltage level by performing a regulating operation without performing a boosting operation on the second power supply voltage VPP. That is, according to the embodiments shown in FIG. 6, the power manager 520 may include only a regulator without a level adjuster, such as a switching mode power supply (SMPS) for boosting the power supply voltage.

Meanwhile, in the embodiments shown in FIG. 6, an example in which the second power supply voltage VPP having a relatively high level is provided to the power manager 520 is illustrated, but the power manager 520 may generate the test power supply voltage V_T by receiving the first power supply voltage VDD and performing a power processing operation.

Figure 7:
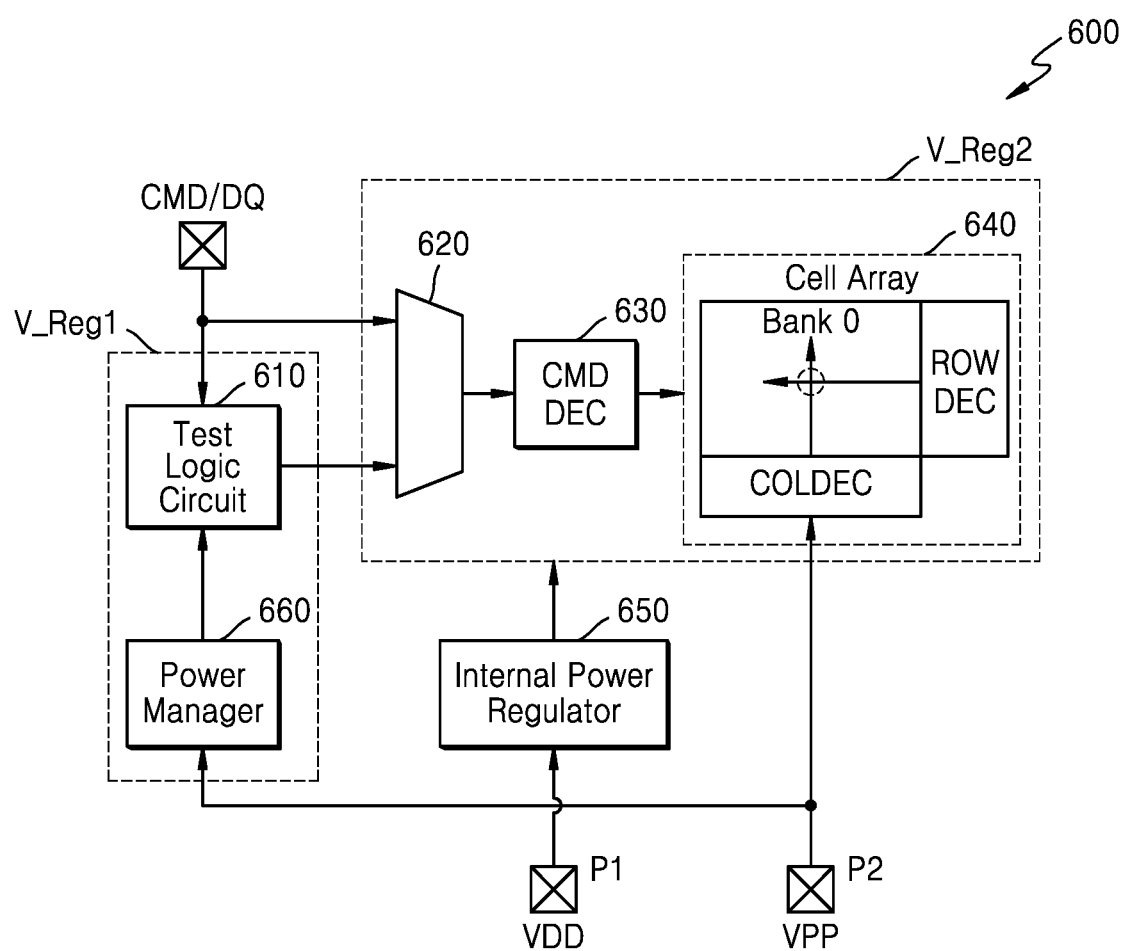
FIG. 7 is a block diagram illustrating an example of a memory device implemented with a single die according to some embodiments of the present disclosure.

FIG. 7 is a block diagram illustrating an example of a memory device implemented with a single die according to some embodiments of the present disclosure.

Referring to FIG. 7, the memory device 600 may include a test logic circuit 610, a selector 620, a command decoder 630, a cell array 640, an internal power regulator 650, and a power manager 660. Also, the memory device 600 may include a first pad P1 receiving the first power supply voltage VDD from an external power source, and a second pad P2 receiving the second power supply voltage VPP, and the test logic circuit 610 may operate in a first power region V_reg1, and the selector 620, the command decoder 630, and the cell array 640 may operate in a second power region V_reg2. Meanwhile, a row decoder and a column decoder may be disposed corresponding to the cell array 640, and the row decoder and the column decoder may operate in the second power region V_reg2.

As shown in FIG. 7, the first power region V_reg1 and the second power region V_reg2 may be separated in one die provided in the memory device 600, and in the test mode, the test logic circuit 610 may receive the test power supply voltage V_T through a different power path from components included in the second power region V_reg2. FIG. 7 illustrates an example in which the power manager 660 receives the second power supply voltage VPP and generates the test power supply voltage V_T through internal processing, such as a regulating operation.

The memory device 600 may receive a command CMD and data DQ through one or more pads, and in a test mode, the command CMD and data DQ may be provided to the test logic circuit 610. The selector 620 may output the command CMD and the data DQ received through one or more pads in the normal mode. On the other hand, in the test mode, the selector 620 may output a command CMD and data DQ from the test logic circuit 610, and the data DQ may correspond to a test pattern. In the test mode, the second power supply voltage VPP may be provided to the cell array 640, the first power supply voltage VDD may be provided to peripheral circuits, such as the selector 620 and the command decoder 630, and the test power supply voltage V_T may be provided in various circuit configurations included in the test logic circuit 610.

Figure 8:
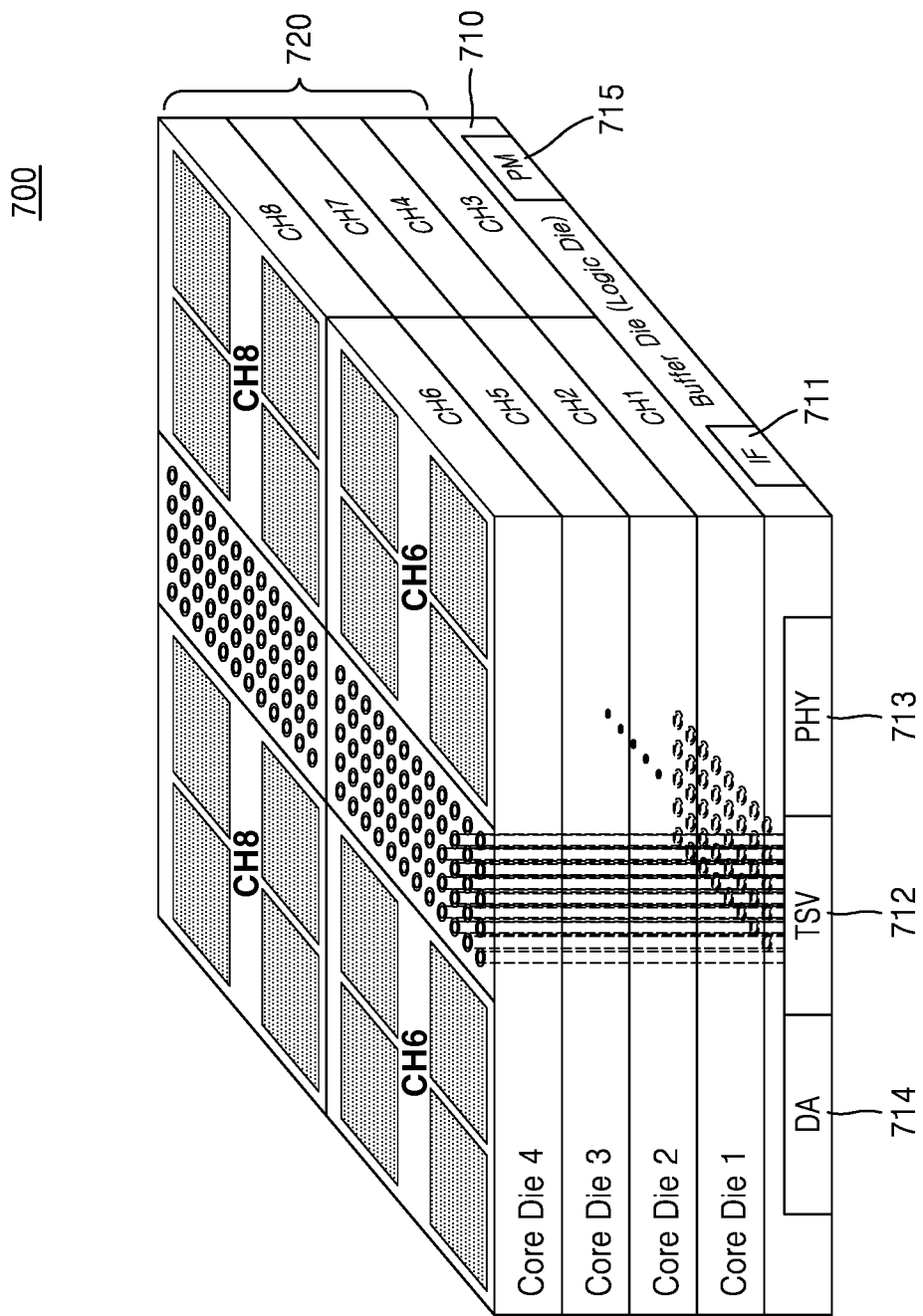
FIG. 8 is a diagram illustrating an example in which a memory device according to some embodiments of the present disclosure includes a high bandwidth memory (HBM)

Hereinafter, an example in which the memory device of the present disclosure includes a plurality of dies is described. FIG. 8 is a diagram illustrating an example in which a memory device according to some embodiments of the present disclosure includes a high bandwidth memory (HBM).

An HBM 700 may have an increased bandwidth by including a plurality of channels having interfaces independent of each other. Referring to FIG. 8, the HBM 700 may include a plurality of dies, and, as an example, may include a buffer die 710 (or a logic die) and one or more core dies 720 stacked thereon. In FIG. 8, an example in which the first to fourth core dies are provided in the HBM 700 is illustrated, but the number of core dies 720 may be variously changed.

Each of the core dies 720 may include one or more channels, and in the example of FIG. 8, as each of the core dies 720 includes two channels, an example in which the HBM 700 has eight channels CH1 to CH8 is illustrated. For example, the first core die includes a first channel CH1 and a third channel CH3, the second core die includes a second channel CH2 and a fourth channel CH4, the third core die may include a fifth channel CH5 and a seventh channel CH7, and the fourth core die may include a sixth channel CH6 and an eighth channel CH8. Each channel may include an array of cells, and may also include a peripheral circuit to control memory operations for the cell array.

The buffer die 710 may include an interface circuit 711 that communicates with a host (or a memory controller), and may receive commands/addresses and data from the host through the interface circuit 711. The host may transmit commands/addresses and data through buses arranged corresponding to the channels, and a bus may be divided for each channel, or a part of the bus may be shared by at least two channels.

Meanwhile, the buffer die 710 may further include a TSV region 712, a physical (PHY) region 713, and a direct access (DA) region 714. Although not shown in FIG. 8, a processor that controls the overall operation of the HBM 700, such as control of a movement path of data, may be further included in the buffer die 710.

The TSV region 712 is a region in which a TSV for communication with the core dies 720 is formed. In addition, the PHY region 713 may include a plurality of input/output circuits for communication with an external host, and as an example, the PHY region 713 may include one or more ports for communication with the host. Meanwhile, the DA region 714 may be disposed to directly communicate with an external tester through a conductive means disposed on the outer surface of the HBM 700 in a test mode of the HBM 700.

In some embodiments, in the test mode, the test pattern may be provided to the core dies 720 through the buffer die 710, and a test logic circuit (not shown) that performs various operations related to testing may be provided in the buffer die 710. For example, the test logic circuit may receive a command and/or a test pattern via a conductive means disposed in the DA region 714, and the test logic circuit may operate based on a predetermined power supply voltage (e.g., a test power supply voltage) to transmit a command and/or a test pattern to the core dies 720.

Also, in some embodiments of the present disclosure, the buffer die 710 may include a power manager 715, and the power manager 715 may provide a test power supply voltage generated through power processing on any one power supply voltage from the outside or external to the test logic circuit. According to the above-described embodiments, the test logic circuit may be included in a different power region from the cell array and peripheral circuits provided in the core dies 720, and accordingly, the power paths may be separated between the test power supply voltage provided to the test logic circuit and one or more power supply voltages provided to the core dies 720.

FIGS. 9A, 9B, 10, and 11 are block diagrams illustrating memory devices according to various embodiments of the present disclosure. The memory device of FIGS. 9A, 9B, 10, and 11 may correspond to an HBM, and the HBM may include a plurality of dies.

Figure 9A:
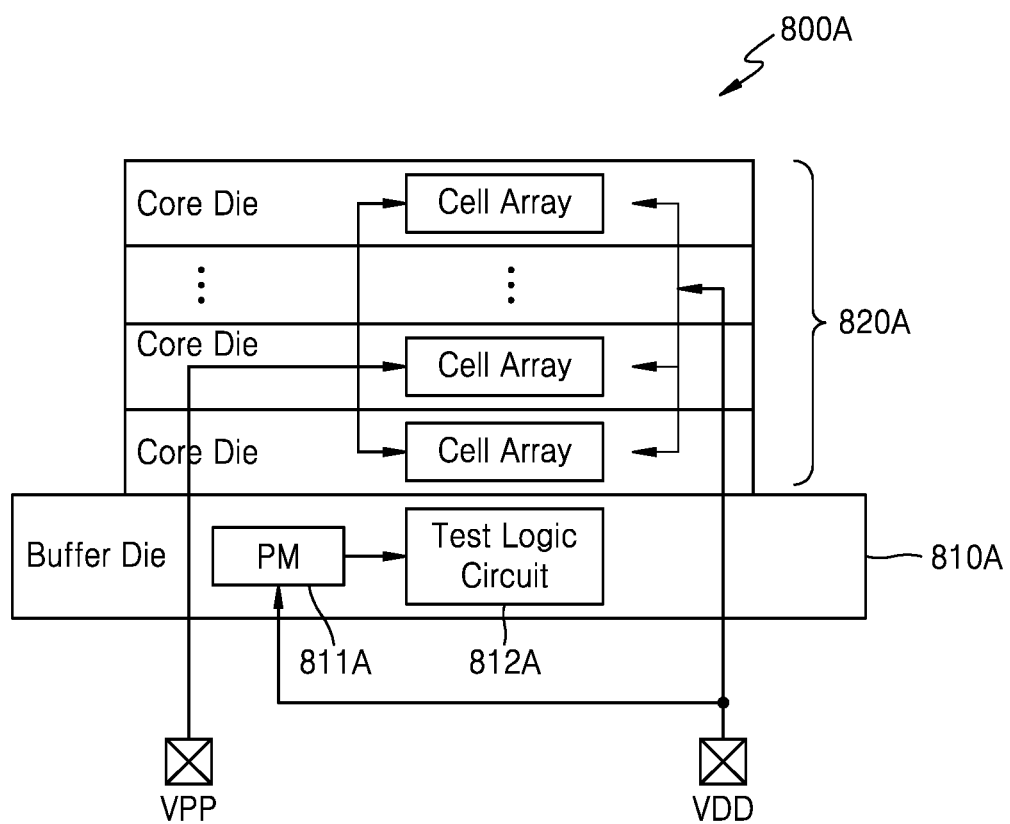
FIGS. 9A, 9B, 10, and 11 are block diagrams illustrating memory devices according to various embodiments of the present disclosure.

As shown in FIG. 9A, a memory device 800A may include a buffer die 810A and one or more core dies 820A stacked thereon, and the buffer die 810A may include pads receiving the first power supply voltage VDD and the second power supply voltage VPP, and also, according to some embodiments of the present disclosure, the buffer die 810A may include a power manager 811A and a test logic circuit 812A. Also, each of the one or more core dies 820A may include an array of cells. Although not shown in FIG. 9A, peripheral circuits for controlling a memory operation performed on the cell array may be disposed on the buffer die 810A or the respective core dies 820A. According to some embodiments, some of the peripheral circuits may be disposed on the buffer die 810A, and some other ones may be disposed on the respective core dies 820A.

According to the above-described embodiments, in the test mode, the power path of the power supply voltage provided to the test logic circuit 812A and the power path of the power supply voltage provided to the cell array and peripheral circuits may be separated from each other. The power manager 811A may receive the first power supply voltage VDD or the second power supply voltage VPP, and as an example, the power manager 811A may generate a test power supply voltage based on a voltage level control and/or regulating operation of the first power supply voltage VDD and provide the generated test power supply voltage to the test logic circuit 812A. On the other hand, the power supply voltage may be transmitted to the cell array and the peripheral circuit through a separate power path, and as an example, the second power supply voltage VPP may be provided to a cell array disposed on each of the core dies 820A, and the first power supply voltage VDD may be provided to a peripheral circuit disposed on each of the core dies 820A.

Figure 9B:
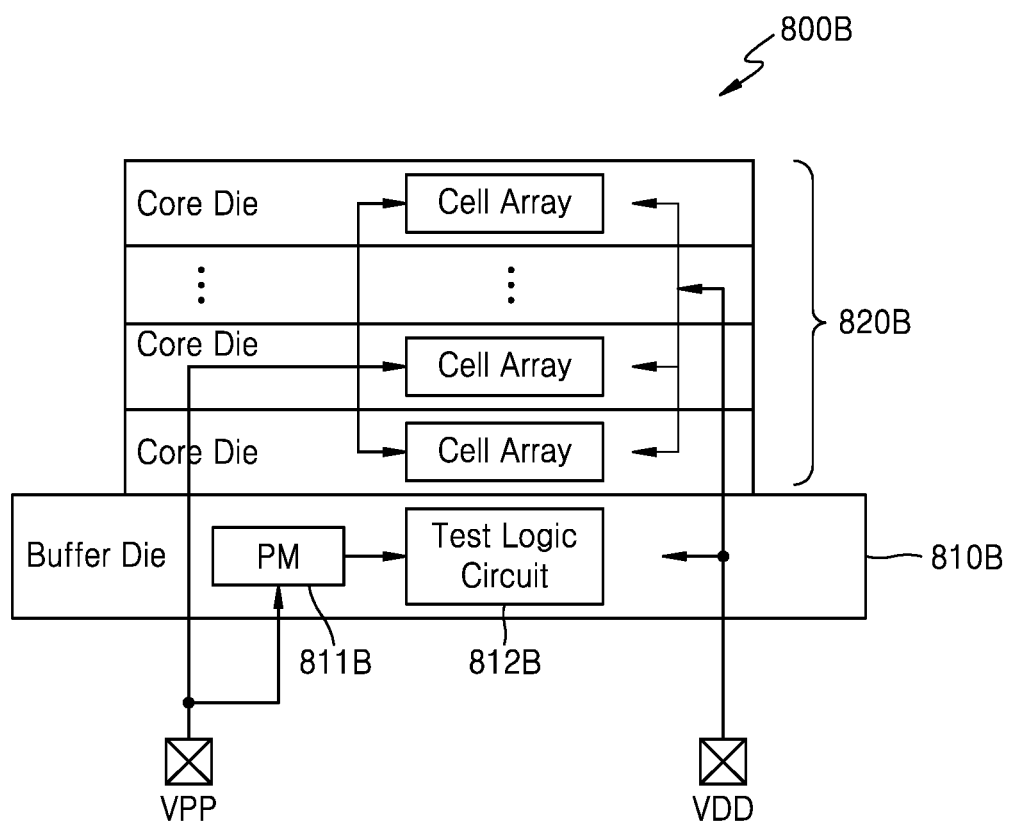

FIG. 9B illustrates a modified example of the memory device of FIG. 9A. In FIG. 9B, a case in which the first power supply voltage VDD is used as the power supply voltage of the buffer die, but the test power supply voltage is provided to the test logic circuit through a power path using another power supply voltage (e.g., the second power supply voltage VPP) is shown as an example.

As shown in FIG. 9B, a memory device 800B may include a buffer die 810B and one or more core dies 820B stacked thereon, and the buffer die 810B may include pads receiving the first power supply voltage VDD and the second power supply voltage VPP, and also, according to some embodiments of the present disclosure, the buffer die 810B may include a power manager 811B and a test logic circuit 812B.

The second power supply voltage VPP may be provided by various components included in the memory device 800B, and as an example, the second power supply voltage VPP may be provided to a cell array disposed on each of the one or more core dies 820B. Also, the second power supply voltage VPP may be provided to the power manager 811B, and the power manager 811B may generate a test power supply voltage and provide the generated test power supply voltage to the test logic circuit 812B.

Meanwhile, the first power supply voltage VDD may be provided to the buffer die 810B and one or more core dies 820B. The buffer die 810B may include components, such as one or more peripheral circuits and/or interface circuits for communication with the outside, and in the buffer die 810B, the power path of the first power supply voltage VDD may be separated from the power path of the test power supply voltage. Accordingly, at least two power paths may be disposed within the buffer die 810B, and in the test mode, the test power supply voltage and the first power supply voltage VDD may be provided together to components in the buffer die 810B through the power paths.

Figure 10:
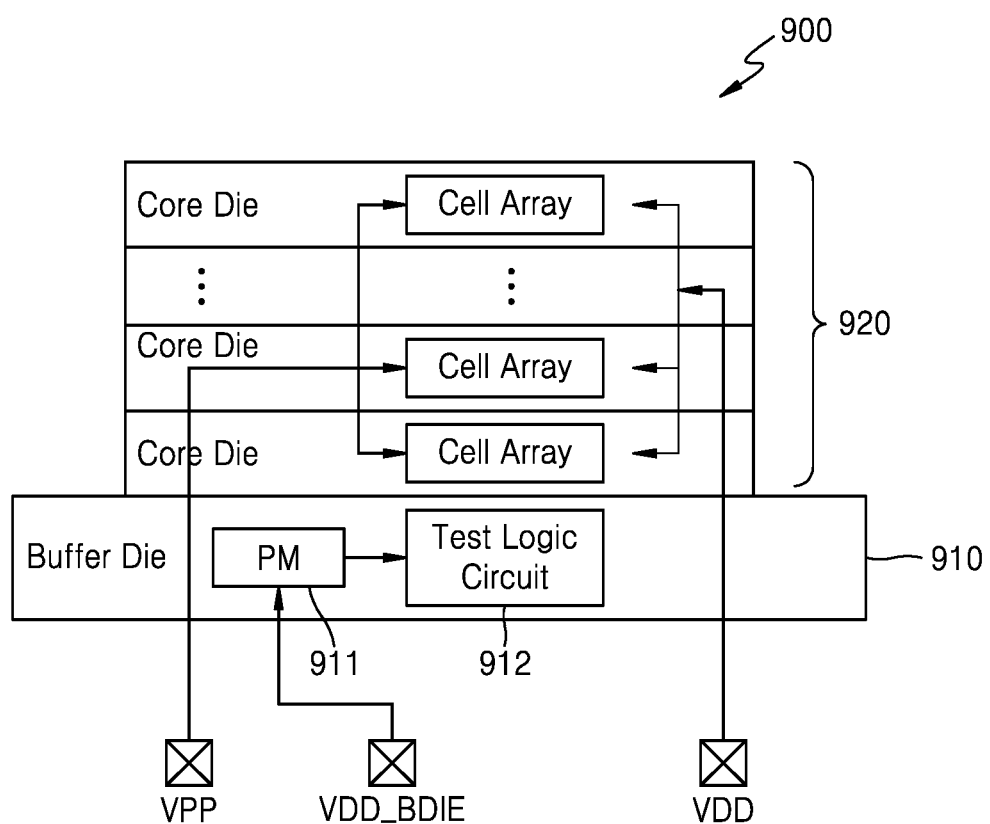
Figure 11:
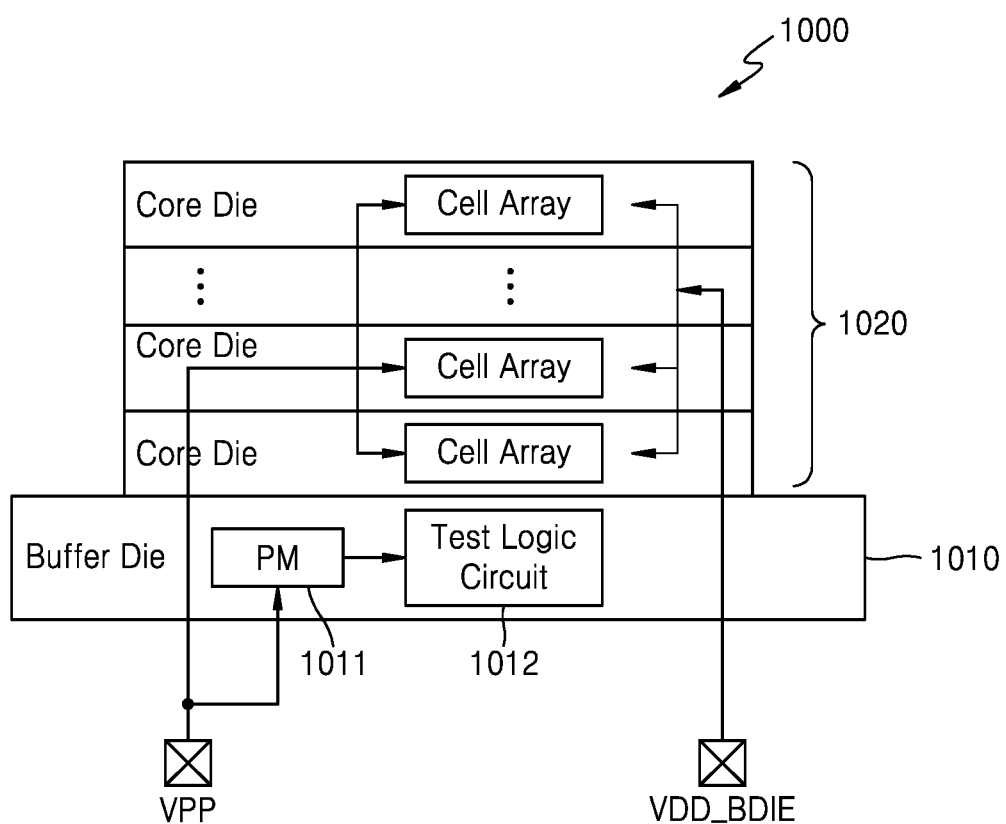

FIGS. 10 and 11 illustrate a case in which power paths of a buffer die and a core die are separated from each other.

Referring to FIG. 10, a memory device 900 may include a buffer die 910 and one or more core dies 920 stacked thereon, and the buffer die 910 may include a first pad receiving the first power supply voltage VDD_CDIE, a second pad receiving the second power supply voltage VPP, and a third pad receiving the third power supply voltage VDD_BDIE, and may also include a power manager 911 and a test logic circuit 912. That is, the buffer die 910 and the core dies 920 may receive different power supply voltages, respectively, through different pads.

In the test mode, the second power supply voltage VPP received through the second pad may be provided to a cell array disposed on each of the core dies 920, and the first power supply voltage VDD_CDIE received through the first pad may be provided to a peripheral circuit disposed on each of the core dies 920. Also, various circuit components included in the buffer die 910 may receive the third power supply voltage VDD_BDIE. Meanwhile, in the test mode, the third power supply voltage VDD_BDIE received through the third pad may be transferred to the test logic circuit 912 through a power path including the power manager 911 in the buffer die 910, and as an example, the power manager 911 may generate a test power supply voltage based on a level control and/or regulating operation of the third power supply voltage VDD_BDIE and provide the generated test power supply voltage to the test logic circuit 912. Meanwhile, in the normal mode, the third power supply voltage VDD_BDIE may be provided to various components in the buffer die 910 through a power path that does not include the power manager 911.

Meanwhile, referring to FIG. 11, a memory device 1000 may include a buffer die 1010 and one or more core dies 1020 stacked thereon, and the buffer die 1010 may include a first pad receiving the first power supply voltage VDD_CDIE and a second pad receiving the second power supply voltage VPP, and the buffer die 1010 may also include a power manager 1011 and a test logic circuit 1012.

The first power supply voltage VDD_CDIE received through the first pad may be provided to one or more core dies 1020, but the second power supply voltage VPP received through the second pad may be provided together to the buffer die 1010 and one or more core dies 1020. Various circuit components included in the buffer die 1010 may receive the second power supply voltage VPP and operate based thereon.

In the test mode, the second power supply voltage VPP received through the second pad may be provided to a cell array disposed on each of the core dies 920, and the first power supply voltage VDD_CDIE received through the first pad may be provided to a peripheral circuit disposed on each of the core dies 920. Also, in the test mode, the second power supply voltage VPP may be provided to the test logic circuit 1012 through a power path including the power manager 1011, and accordingly, a power path through which the second power supply voltage VPP is provided to the cell array in the test mode and a power path through which the test power supply voltage generated through the second power supply voltage VPP is provided to the test logic circuit 1012 may be separated from each other.

Figure 12:
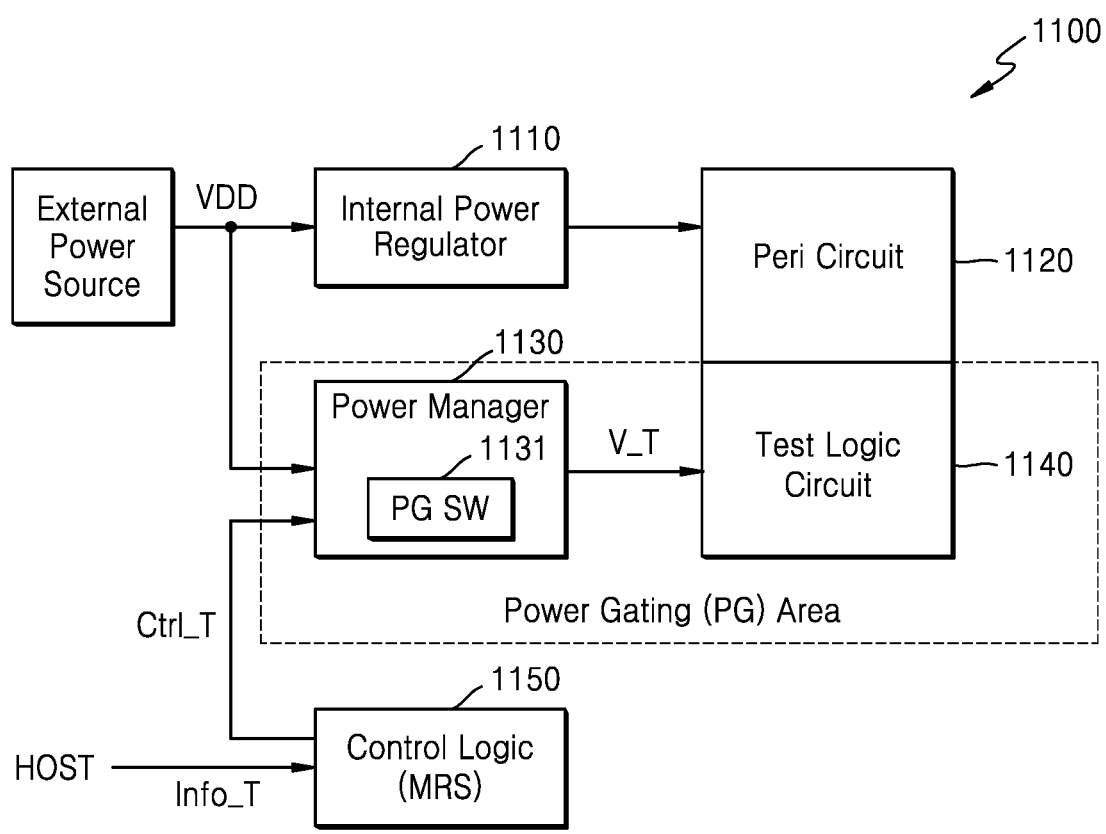
FIGS. 12 to 14 are diagrams illustrating a method of testing a memory device, according to some embodiments of the present disclosure.
Figure 13:
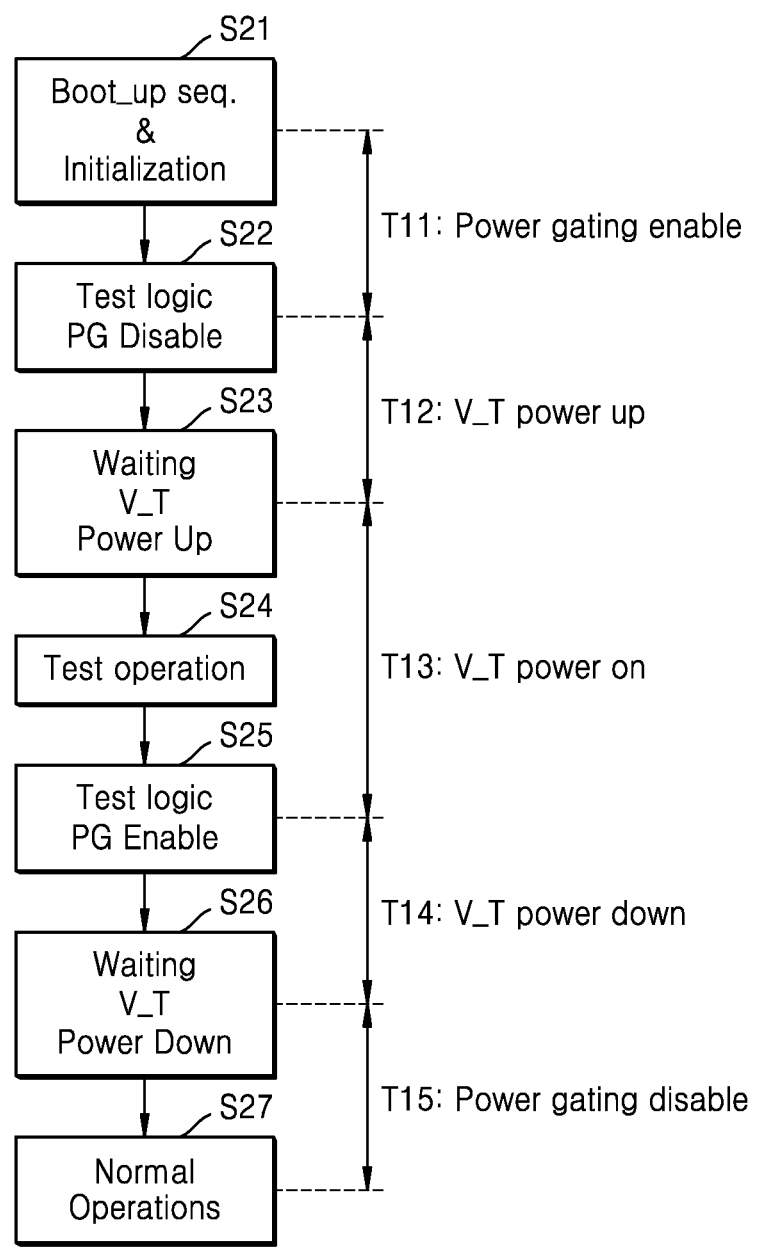
Figure 14:
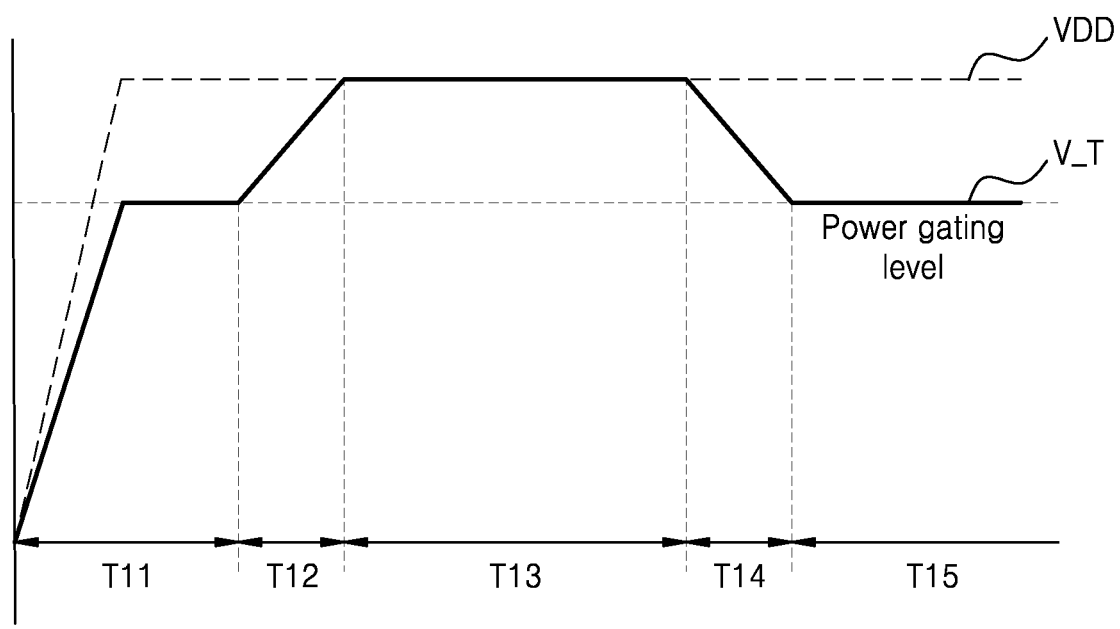

FIGS. 12 to 14 are diagrams illustrating a method of testing a memory device, according to some embodiments of the present disclosure. In FIGS. 12 to 14, a case in which a power gating switch is provided in the power manager and power consumed by a first power region including a test logic circuit is adjusted is shown as an example.

Referring to FIG. 12, the memory device 1100 may include an internal power regulator 1110, a peripheral circuit 1120, a power manager 1130, a test logic circuit 1140, and a control logic 1150, and the power manager 1130 may include a power gating switch 1131. In addition, the memory device 1100 may receive the first power supply voltage VDD from an external power source, and the power manager 1130 may generate the test power supply voltage V_T through power processing on the first power supply voltage VDD. According to some embodiments, the power gating switch 1131 may switch the test power supply voltage V_T, and the power gating switch 1131 may correspond to a switch capable of adjusting the degree of electrical connection according to whether the power gating switch 1131 is turned on or off. Accordingly, when the power gating switch 1131 is turned on, the voltage level of the test power supply voltage V_T maintains the target voltage level of the power manager 1130, but when the power gating switch 1131 is turned off, the voltage level of the test power supply voltage V_T may be reduced to a value lower than the target voltage level of the power manager 1130.

The first power region including the power manager 1130 and the test logic circuit 1140 may correspond to a power gating PG area, and power gating may be enabled or disabled through the power gating switch 1131 according to the test section and the normal section. As an example, when the power gating switch 1131 is turned on in the test section, power gating is disabled, and the test power supply voltage V_T may maintain a target voltage level having a relatively high level, and accordingly, a test operation on the memory device 1100 may be performed. On the other hand, when the power gating switch 1131 is turned off in the normal section, power gating is enabled and the power control operation may be performed so that the test power supply voltage V_T has a relatively low level, and accordingly, power consumption in the power gating PG area in the normal section of the memory device 1100 may be reduced.

Meanwhile, the power gating PG control operation in the test mode may be controlled by the host. The host may correspond to a memory controller or an AP including the same, or the host may be an external test device that performs a test operation on the memory device 1100. The host may provide the power control information Info_T to the memory device 1100, and as an example, the power control information Info_T may correspond to any one of commands defined in the DRAM specification, or the power control information Info_T may correspond to setting information provided from the host and set in the memory device 1100.

The control logic 1150 may provide a power control signal Ctrl_T for controlling the power gating operation of the power manager 1130 based on the power control information Info_T from the host. For example, when the power control information Info_T corresponds to the command, the control logic 1150 may perform command decoding on the power control information Info_T and generate a power control signal Ctrl_T according to the decoding result. According to some embodiments, the control logic 1150 may include a mode register set (MRS), and the host may set mode register information in the MRS by providing an MRS command. The control logic 1150 may generate the power control signal Ctrl_T based on information set in the MRS.

An example of a test operation of the memory device 1100 shown in FIG. 12 will be described with reference to FIG. 13.

As power is applied to the memory device 1100, a booting sequence of the memory device 1100 may be performed and an initialization operation may be performed in operation S21. In addition, as the power gating PG for the test power supply voltage V_T provided to the test logic circuit 1140 is disabled in operation S22, the voltage level of the test power supply voltage V_T may rise, and a test operation may be queued during the power-up section in which the voltage level of the test power supply voltage V_T rises in operation S23. Thereafter, as the power-up section elapses, a test operation using the test logic circuit 1140 may be performed in operation S24.

As the test operation is completed, power gating PG for the test power supply voltage provided to the test logic circuit 1140 may be enabled in operation S25, and during the power-down section in which the voltage level of the test power supply voltage is decreased, the normal operation may be queued in operation S26. As the voltage level of the test power supply voltage decreases, power consumed by the test logic circuit 1140 or the power gating PG area may be reduced, and then a normal operation may be performed in operation S27.

FIG. 14 illustrates an example of voltage level variation of the first power supply voltage VDD and the test power supply voltage V_T in the operations of FIG. 13. In FIG. 14, a case in which the power manager 1130 generates the test power supply voltage V_T by using the first power supply voltage VDD is shown as an example. Also, in the test mode, a case where the target voltage level of the test power supply voltage V_T is the same as the target voltage level of the first power supply voltage VDD is shown as an example.

Referring to FIGS. 12 to 14, a section T11 between the performance of the initialization operation and the disabling of the power gating PG may correspond to a state in which the voltage level of the first power supply voltage VDD provided from the outside or external to the memory device increases and power gating is enabled. Accordingly, in section T11, the test power supply voltage V_T may reach a voltage level lower than that of the first power supply voltage VDD.

Meanwhile, the section T12 between the disabling of the power gating PG and the standby of the test operation during the power-up section may correspond to the power-up section of the test power supply voltage V_T, and in section T12, as the voltage level of the test power supply voltage V_T increases, the voltage level of the test power supply voltage V_T may rise to the voltage level of the first power supply voltage VDD. After that, the test operation is performed after the waiting for the test operation is completed, and a section T13 during which the power gating PG is enabled may correspond to a power-on section of the test power supply voltage V_T in which the voltage level of the test power supply voltage V_T is maintained constant at a relatively high value, and in section T13, the voltage level of the test power supply voltage V_T may maintain a value corresponding to the voltage level of the first power supply voltage VDD.

Meanwhile, the section T14 between the enable of the power gating PG and the standby for the normal operation may correspond to the power-down section of the test power supply voltage V_T, and in section T14, the voltage level of the test power supply voltage V_T may be reduced. As an example, in FIG. 14, the case in which the voltage level of the test power supply voltage V_T is reduced to the same value as in section T11 is shown as an example, but the voltage level of the test power supply voltage V_T may be reduced to a lower value than in section T11. Thereafter, the section T15 between the standby of the normal operation (or the standby of the power-down of the test power supply voltage V_T) and the normal operation may correspond to a state in which power gating is disabled, and in section T15, a normal operation of the memory device 1100 may be performed in a state in which power consumed by the power gating region is reduced.

While the inventive concept has been particularly shown and described with reference to embodiments thereof, it will be understood that various changes in form and details may be made therein without departing from the spirit and scope of the following claims.

What is claimed is:

1. A memory device comprising:
a cell array comprising a plurality of memory cells;
a peripheral circuit configured to control a memory operation of the plurality of memory cells;
a test logic circuit configured to operate in a test mode and configured to perform a test operation on the plurality of memory cells;
a first regulator configured to regulate a first power supply voltage received through a first pad and provide the first power supply voltage to at least one of the cell array and the peripheral circuit; and
a power manager between the first pad and an input terminal of the first regulator, and between the first pad and the test logic circuit,
wherein the power manager is configured to provide a test power supply voltage generated through a power processing operation for the first power supply voltage to the test logic circuit,
wherein, in the test mode, while a first target voltage level of the first regulator fluctuates, a second target voltage level of the power manager is maintained constant.

2. The memory device of claim 1, wherein the power manager comprises:
a voltage level adjuster configured to receive the first power supply voltage and increase a voltage level of the first power supply voltage; and
a second regulator configured to receive an output voltage from the voltage level adjuster and regulate the output voltage to generate the test power supply voltage having a voltage level corresponding to the second target voltage level.

3. The memory device of claim 2, wherein the voltage level adjuster comprises a Switching Mode Power Supply (SMPS), and the second regulator comprises a Low Drop-Out (LDO) regulator.

4. The memory device of claim 1, further comprising:
a second pad configured to receive a second power supply voltage from external to the memory device,
wherein the second power supply voltage is provided to the first regulator without being provided to the power manager.

5. The memory device of claim 4,
wherein the first power supply voltage has a higher voltage level than the second power supply voltage,
wherein the first power supply voltage is provided to the cell array through a path different from a power path through which the test power supply voltage is transmitted, and the second power supply voltage is provided to the peripheral circuit through a path different from a power path through which the test power supply voltage is transmitted, and
wherein the power manager is configured to generate the test power supply voltage through a regulating operation for the first power supply voltage.

6. The memory device of claim 4,
wherein the first power supply voltage has a lower voltage level than the second power supply voltage,
wherein the first power supply voltage is provided to the peripheral circuit through a path different from a power path through which the test power supply voltage is transmitted, and the second power supply voltage is provided to the cell array through a path different from a power path through which the test power supply voltage is transmitted, and wherein the power manager is configured to generate the test power supply voltage through a voltage level control and regulating operation for the first power supply voltage.

7. The memory device of claim 6, wherein the power manager boosts a voltage level of the first power supply voltage and then performs the regulating operation to generate the test power supply voltage having a voltage level corresponding to the second target voltage level.

8. The memory device of claim 1,
wherein the memory device comprises a plurality of dies, the test logic circuit and the power manager are on a first die, and the cell array is on a second die stacked on the first die,
wherein the first power supply voltage is provided to the second die through the first regulator, and
wherein the test power supply voltage from the power manager is provided to the test logic circuit in the first die.

9. The memory device of claim 8, wherein the peripheral circuit is further in the first die, and the first power supply voltage is provided to the peripheral circuit in the first die through the first regulator.

10. The memory device of claim 1, wherein the test logic circuit comprises a built-in self-test (BIST) circuit, and the BIST circuit comprises a pattern generator for generating a test pattern provided to the cell array.

11. The memory device of claim 1,
wherein the cell array comprises a plurality of banks,
wherein the test logic circuit comprises a bank controller enabling the plurality of banks so that a test pattern provided from external to the memory device is provided together to the plurality of banks, and
wherein the test logic circuit is in a first power region that is different from a second power region comprising the cell array and the peripheral circuit.

12. The memory device of claim 1,
wherein the power manager comprises a power gating switch,
wherein, after the test mode is terminated, as the power gating switch is turned off, the test power supply voltage is reduced to a voltage level lower than that of the first power supply voltage.

13. A memory device comprising:
a cell array comprising a plurality of memory cells;
a peripheral circuit configured to control a memory operation of the plurality of memory cells;
a test logic circuit operating in a test mode and configured to perform test logic on the plurality of memory cells;
a first pad configured to receive a first power supply voltage from external to the memory device;
a second pad configured to receive a second power supply voltage having a different voltage level from the first power supply voltage from external to the memory device; and
a power manager configured to receive the first power supply voltage or the second power supply voltage and configured to generate a test power supply voltage provided to the test logic circuit,
wherein, in the test mode, the test logic circuit is configured to receive the test power supply voltage through a first power path including the power manager, the cell array is configured to receive the first power supply voltage through a second power path that does not include the power manager, and the peripheral circuit is configured to receive the second power supply voltage through a third power path that does not include the power manager.

14. The memory device of claim 13,
wherein the first power supply voltage has a higher voltage level than the second power supply voltage, and
wherein the power manager is between the second pad and the test logic circuit, and is configured to generate the test power supply voltage based on a boosting operation and a regulating operation for the second power supply voltage.

15. The memory device of claim 13,
wherein the first power supply voltage has a higher voltage level than the second power supply voltage, and
wherein the power manager is between the first pad and the test logic circuit, and is configured to generate the test power supply voltage based on a regulating operation for the first power supply voltage.

16. The memory device of claim 13, further comprising:
a regulator electrically connected to the cell array or the peripheral circuit,
wherein, in the test mode, the regulator is configured to regulate the first power supply voltage and/or the second power supply voltage.

17. The memory device of claim 16, wherein, in the test mode, while a first target voltage level of the regulator fluctuates, a second target voltage level of the power manager is maintained constant.

18. A test method of a memory device, the method comprising:
providing a first power supply voltage received from external to the memory device to a cell array or a peripheral circuit through a first power path including a first regulator;
providing the first power supply voltage to a power manager enabled in a test mode; and
providing a test power supply voltage generated by the power manager to a test logic circuit through a second power path that is different from the first power path and comprises the power manager,
wherein, in the test mode, while a first target voltage level of the first regulator fluctuates, a second target voltage level of the power manager is maintained constant.

19. The method of claim 18, further comprising:
receiving a second power supply voltage from external to the memory device,
wherein the first power supply voltage is provided to the peripheral circuit, and the second power supply voltage is provided to the cell array.

20. The method of claim 19,
wherein the first power supply voltage has a lower voltage level than the second power supply voltage, and
wherein the power manager generates the test power supply voltage through voltage level boosting and regulating operations for the first power supply voltage.

* * * * *